(12) United States Patent
Mignot et al.

(10) Patent No.: US 11,670,580 B2
(45) Date of Patent: Jun. 6, 2023

(54) SUBTRACTIVE VIA ETCH FOR MIMCAP

(71) Applicant: International Business Machines Corporation, Armonk, NY (US)

(72) Inventors: Yann Mignot, Slingerlands, NY (US); Hsueh-Chung Chen, Cohoes, NY (US); Junli Wang, Slingerlands, NY (US); Mary Claire Silvestre, Clifton Park, NY (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/461,096

(22) Filed: Aug. 30, 2021

(65) Prior Publication Data

US 2023/0063908 A1    Mar. 2, 2023

(51) Int. Cl.
*H01L 23/522*    (2006.01)
*H01L 49/02*    (2006.01)

(52) U.S. Cl.
CPC .......... *H01L 23/5223* (2013.01); *H01L 28/90* (2013.01)

(58) Field of Classification Search
CPC .................................................. H01L 23/5223
See application file for complete search history.

(56) References Cited

U.S. PATENT DOCUMENTS

| | | | |
|---|---|---|---|
| 6,008,083 A * | 12/1999 | Brabazon | H01L 28/40 257/E21.59 |
| 6,927,440 B2 | 8/2005 | Greco et al. | |
| 7,439,151 B2 | 10/2008 | Coolbaugh et al. | |
| 7,670,921 B2 | 3/2010 | Chinthakindi et al. | |
| 8,842,412 B2 | 9/2014 | Dunn et al. | |
| 2005/0121744 A1* | 6/2005 | Chang | H01L 23/5223 257/532 |
| 2009/0200638 A1 | 8/2009 | Smith | |
| 2015/0123242 A1* | 5/2015 | Jen | H01L 23/5223 257/532 |
| 2015/0325635 A1* | 11/2015 | Zang | H01L 28/60 257/532 |
| 2020/0066622 A1* | 2/2020 | Jain | H01L 23/49822 |

OTHER PUBLICATIONS

Ng, C. H., et al., "MIM Capacitor Integration for Mixed-Signal/RF Applications", IEEE Transactions on Electron Devices, Jul. 2005, pp. 1399-1409, vol. 52, No. 7.
IPCOM000177917D, "Methods for forming metal-insulator-metal capacitor, thin film resistor, and BEOL metal wire interconnect simultaneously", Original Publication Date: Jan. 9, 2009, 4 pages.

* cited by examiner

*Primary Examiner* — Omar F Mojaddedi
(74) *Attorney, Agent, or Firm* — Scully, Scott, Murphy & Presser, P.C.; L. Jeffrey Kelly, Esq.

(57) ABSTRACT

Structures are provided that include a metal-insulator-metal capacitor (MIMCAP) present in the back-end-of-the-line (BEOL). The MIMCAP includes at least one of the bottom electrode and the top electrode having a via portion and a base portion that is formed utilizing a subtractive via etch process. Less via over etching occurs resulting in improved critical dimension control of the bottom and/or top electrodes that are formed by the subtractive via etch process. No bottom liner is present in the MIMCAP thus improving the resistance/capacitance of the device. Also, and in some embodiments, a reduced foot-print area is possible to bring the via portion of the bottom electrode closer to the top electrode.

17 Claims, 6 Drawing Sheets

SUBTRACTIVE VIA ETCH FOR MIMCAP

BACKGROUND

The present application relates to semiconductor technology, and more particularly to a metal-insulator-metal capacitor (MIMCAP) that is embedded in the back-end-of-the-line (BEOL).

A capacitor is a passive two-terminal electrical component that stores electrical energy in an electric field. A capacitor is a component designed to add capacitance to a circuit. Capacitors are widely used in electronic circuits for blocking direct current while allowing alternating current to pass.

Metal-insulator-metal capacitors (MIMCAPs) are one type of capacitor design that is valuable in many applications. For example, MIMCAPs can be used in radio frequency (RF) circuits, in various configurations in analog integrated circuits (ICs), and for decoupling capacitance in high power microprocessor units (MPUs). MIMCAPs are also useful in dynamic access random memory (DRAM) cells. MIMCAPs include two metal plates (or electrodes) separated by an insulator material. Typically, the MIMCAPs are formed in one of the interconnect levels of a BEOL structure.

One problem with conventional MIMCAPs embedded in the BEOL is that during the formation of the contact vias to the bottom electrode and top electrode over etching can occur which can punch through the top electrode. This can lead to a poor via contact which is undesirable in many MIMCAP applications. There is thus a need for providing MIMCAPs in which over etching of the capacitor electrodes is circumvented.

SUMMARY

A structure is provided that includes a MIMCAP present in the BEOL. The MIMCAP includes at least one of the bottom electrode and the top electrode having a via portion and a base portion that is formed utilizing a subtractive via etch process. Less via over etching occurs resulting in improved critical dimension control of the bottom and/or top electrodes that are formed by the subtractive via etch process. No bottom liner is present in the MIMCAP thus improving the resistance/capacitance of the device. Also, and in some embodiments, a reduced foot-print area is possible to bring the via portion of the bottom electrode closer to the top electrode.

In one aspect of the present application, a structure including a MIMCAP is provided. In one embodiment, the structure includes a bottom electrode located on a surface of an interconnect level, the bottom electrode having a base portion and a via portion that extends upward from a surface of the base portion. A capacitor high-k dielectric material layer is located on the base portion of the bottom electrode, and a top electrode is located on the capacitor high-k dielectric material layer. The structure further includes a first contact structure contacting the via portion of the bottom electrode, and a second contact structure contacting the top electrode.

In another embodiment, the structure includes a bottom electrode located on a surface of an interconnect level, the bottom electrode having a base portion and a via portion that extends upward from a surface of the base portion. A capacitor high-k dielectric material layer is located on the base portion of the bottom electrode, and a top electrode is located on the capacitor high-k dielectric material layer, the top electrode having a base portion and a via portion that extends upward from a surface of the base portion. The structure further includes a first contact structure contacting the via portion of the bottom electrode, and a second contact structure contacting the via portion of the top electrode.

In yet another embodiment, the structure includes a bottom electrode located on a surface of an interconnect level. A capacitor high-k dielectric material layer is located on the bottom electrode, and a top electrode is located on the capacitor high-k dielectric material layer, the top electrode having a base portion and a via portion that extends upward from a surface of the base portion. The structure further includes a first contact structure contacting the bottom electrode, and a second contact structure contacting the via portion of the top electrode.

It is noted that in any of the structure embodiments of the present application the bottom electrode, capacitor high-k dielectric material layer, and top electrode layer define a MIMCAP of the present application.

In another aspect of the present application, methods of forming the structures mentioned above are provided. In the various methods of the present application, a subtractive via etch process is used to form the bottom electrode, the top electrode, or both the bottom and top electrodes. The subtractive via etch process provides an electrode (bottom and/or top) that has a via portion extending upwards from a base portion.

DETAILED DESCRIPTION

Figure 1:
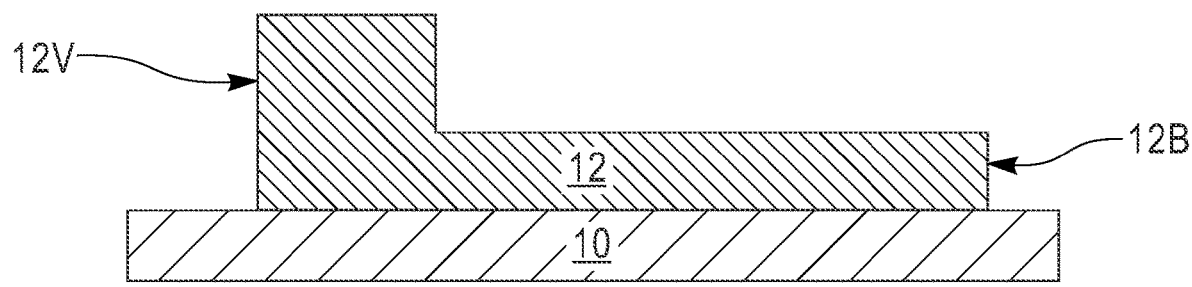
FIG. 1 is a cross sectional view of an exemplary structure that can be employed in the present application, the exemplary structure including a bottom electrode having a base portion and a via portion located on a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary structure that can be employed in the present application, the exemplary structure including a bottom electrode 12 having a base portion 12B and a via portion 12V located on a first interconnect dielectric material layer 10.

The first interconnect dielectric material layer 10 represents a lower interconnect level of a multilayered interconnect structure. Although not shown, a front-end-of-the-line (FEOL) level or combination of a FEOL and a middle-of-the-line (MOL) level can be present beneath this lower interconnect level. Also, other interconnect levels can be located between the lower interconnect level containing the first interconnect dielectric material layer 10 and the FEOL, or between the lower interconnect level containing the first interconnect dielectric material layer 10 and the combination of the FEOL and the MOL. The FEOL level includes a semiconductor substrate and one or more semiconductor devices, such as, for example, transistors, resistors, diodes, and/or capacitors.

Although not shown, one or more electrically conductive structures can be embedded in the first interconnect dielectric material layer 10. The one or more electrically conductive structures that can be present in the first interconnect dielectric material layer 10 are composed of an electrically conductive metal or an electrically conductive metal alloy. Examples of electrically conductive metals include, for example, copper (Cu), aluminum (Al), tungsten (W), or cobalt (Co). An example of an electrically conductive metal alloy that can be used is a copper-aluminum alloy.

In some embodiments (not shown), a diffusion barrier material can be present at least along the sidewall of the one or more electrically conductive structures; the diffusion barrier liner can also extend along at least a portion of the bottom wall of the one or more electrically conductive structures. When present, the diffusion barrier liner is composed of a diffusion barrier material including, but not limited to, tantalum (Ta), tantalum nitride (TaN), titanium (Ti), titanium nitride (TiN), ruthenium (Ru), ruthenium nitride (RuN), a ruthenium-tantalum alloy (RuTa), a ruthenium tantalum nitride alloy (RuTaN), tungsten (W), or tungsten nitride (WN). The diffusion barrier material serves as a barrier to prevent the electrically conductive material that provides the one or more electrically conductive structures from diffusing there through. It is noted that the diffusion barrier material that provides the diffusion barrier liner is compositionally different from the electrically conductive material that provides the one or more electrically conductive structures.

The formation of the one or more electrically conductive structures and, optionally, the diffusion barrier liner in the first interconnect dielectric material layer 10 can be performed utilizing techniques well known to those skilled art. For example, a single or dual damascene process can be used to form the one or more electrically conductive structures and, optionally, the diffusion barrier liner in the first interconnect dielectric material layer 10. So as not to obscure the present application, details concerning the formation of the one or more electrically conductive structures and, optionally, the diffusion barrier liner in the first interconnect dielectric material layer 10 are not provided.

The first interconnect dielectric material layer 10 can be composed of an inorganic dielectric material, an organic dielectric material or a multilayered stack of inorganic dielectric materials, organic dielectric materials or inorganic and organic dielectric materials. In some embodiments, the first interconnect dielectric material layer 10 can be porous. In other embodiments, the first interconnect dielectric material layer 10 can be non-porous. Examples of suitable dielectric materials that can be employed as the first interconnect dielectric material layer 10 include, but are limited to, silicon dioxide, undoped or doped silicate glass, silsesquioxanes, C doped oxides (i.e., organosilicates) that include atoms of Si, C, O and H, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

In some embodiments of the present application, the first interconnect dielectric material layer 10 has a dielectric constant (all dielectric constants mentioned herein are measured relative to a vacuum, unless otherwise stated) that is 4.0 or less. In some embodiments, the first interconnect dielectric material layer 10 has a dielectric constant of 2.8 or less.

The first interconnect dielectric material layer 10 can be formed by a deposition process such as, for example, chemical vapor deposition (CVD), plasma enhanced chemical vapor deposition (PECVD) or spin-on coating. The first interconnect dielectric material layer 10 can have a thickness from 50 nm to 250 nm. Other thicknesses are contemplated and can be used as the thickness of the first interconnect dielectric material layer 10.

In some embodiments (not shown), a dielectric capping layer can be formed on the first interconnect dielectric material layer prior to forming the bottom electrode 12. When present, the dielectric capping layer is composed of dielectric material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)), aluminum oxide ($AlO_x$) or a multilayered stack of at least one of the aforementioned dielectric capping materials. The dielectric capping layer is typically compositionally different from the first interconnect dielectric material layer 10. The dielectric material that provides the dielectric capping layer can be formed utilizing a deposition process such as, for example, CVD, PECVD, atomic layer deposition (ALD), chemical solution deposition or evaporation. When present, the dielectric capping layer can have a thickness from 10 nm to 100 nm. Other thicknesses are contemplated and can be used as the thickness of the optional dielectric capping layer.

The bottom electrode 12 having the base portion 12B and the via portion 12V is then formed. In one embodiment and as is depicted in FIG. 1, the bottom electrode 12 is formed directly on the first interconnect dielectric material layer 10. In another embodiment, and when the dielectric capping layer is present, the bottom electrode 12 is formed directly on the dielectric capping layer.

The bottom electrode 12 is formed utilizing a subtractive via etch process. The subtractive via etch process that is used in providing the bottom electrode 12 includes forming a bottom electrode metal-containing material layer (not shown) on the surface of either the first interconnect dielectric material layer 10, or if present, the dielectric capping layer. The bottom electrode metal-containing material layer includes any conductive electrode material that can be etched utilizing the subtractive via etch process of the present application. Examples of conductive electrode materials that can be used as bottom electrode metal-containing material layer include, but are not limited to, tantalum (Ta), titanium (Ti), tungsten (W), aluminum (Al), ruthenium (Ru), rhodium (Rh), cobalt (Co), molybdenum (Mo), titanium nitride (TiN), or tantalum nitride (TaN). Note that copper (Cu) cannot be used since copper is a metal that is difficult to etch utilizing existing etching processes.

The bottom electrode metal-containing material layer can be formed utilizing a deposition process including, for example, CVD, PECVD, physical vapor deposition (PVD), ALD, sputtering, or other like deposition processes. The bottom electrode metal-containing material layer can have a thickness from 10 nm to 100 nm; although other thicknesses are contemplated and can be used in the present application as the thickness of the bottom electrode metal-containing material layer.

After forming the bottom electrode metal-containing material layer, a dielectric hard mask layer (not shown) and a first masking layer (not shown) are formed utilizing any suitable deposition process. The dielectric hard mask layer can be composed of silicon dioxide, silicon nitride, silicon oxynitride or any combination thereon. The first masking layer can be composed of any well-known photoresist material. An optional antireflective coating (ARC) layer can be present in the first masking layer. Next, a first patterning step is used to form a patterned bottom electrode metal-containing material layer that has a shape of a line (or trench); this step defines the shape of the base portion 12B of the bottom electrode 12. The first patterning step includes exposing the first masking layer to a desired pattern (e.g., a line pattern in this instance) of radiation, and developing the exposed first masking layer. The pattern (e.g., line pattern) is then transferred into the hard mask layer and the underlying bottom electrode metal-containing material layer utilizing one or more etching steps. The one or more etching steps includes a first etch that is selective in removing non-protected portions of the bottom electrode metal-containing material layer. In one example, and when ruthenium is used as the bottom electrode metal-containing material layer, the first etch can include a mixture of oxygen chloride ($Cl_2$)/helium (He) and argon (Ar). After first patterning the bottom electrode metal-containing material layer, the patterned hard mask layer and the patterned first masking layer are removed utilizing one or more material removal processes. For example, a photoresist stripping process, followed by a planarization process can be used to remove the patterned first masking layer and the patterned hard mask layer, respectively.

The subtractive via etch process continues by forming a second patterned masking layer that covers a portion of the line patterned bottom electrode metal-containing material layer. The second patterned masking layer is composed of a second photoresist material that can be compositionally the same as, or compositionally different from, the photoresist material that provides the first masking layer; and ARC can also be present. The exposed portion of the line patterned bottom electrode metal-containing material layer is then partially removed (i.e., it is recessed) utilizing a second etch that is selective in partially removing (i.e., recessing) the non-protected portions of the line patterned bottom electrode metal-containing material layer. The second etch can be the same as the first etch. The second etch can be referred to as a top via etching process since it provides the via portion 12V of the resultant bottom electrode 12. After the second etch, the patterned second masking layer can be removed utilizing a material removal process including, for example, a photoresist stripping process.

The aforementioned subtractive etch process forms the bottom electrode 12 that has a base portion 12B and a via portion 12V. The bottom electrode 12 including the base portion 12B and the via portion 12V is of unitary construction (i.e., a same work piece), and is composed of a same conductive electrode material throughout the entirety of the bottom electrode 12. The via portion 12V extends upward from a surface of the base portion 12B. In one example, the via portion 12V extends upward from one of the ends of the base portion 12B. The base portion 12B has a shape of a line (or trench). In such an example, a sidewall of the via portion 12V of the bottom electrode 12 can be vertically aligned with a sidewall of the base portion 12B of the bottom electrode 12.

Figure 2:
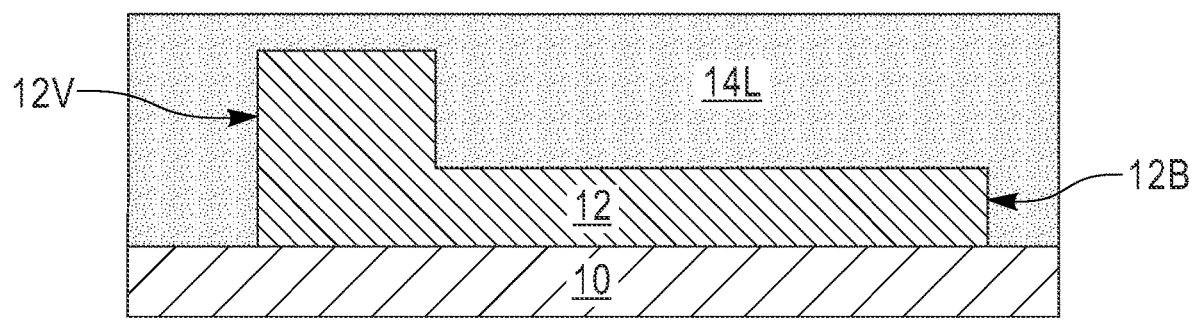
FIG. 2 is a cross sectional view of the exemplary structure of FIG. 1 after forming a second interconnect dielectric material layer over the first interconnect dielectric material layer and the bottom electrode.

Referring now to FIG. 2, there is illustrated the exemplary structure of FIG. 1 after forming a second interconnect dielectric material layer 14L over the first interconnect dielectric material layer 10 and the bottom electrode 12. The second interconnect dielectric material layer 14L can include one of the dielectric materials mentioned above for the first interconnect dielectric material layer 10. The dielectric material that provides the second interconnect dielectric material layer 14L can be compositionally the same as, or compositionally different from, the dielectric material that provides the first interconnect dielectric material layer 10. The second interconnect dielectric material layer 14L can be formed utilizing one of the deposition processes mentioned above for forming the first interconnect dielectric material layer 10. The second interconnect dielectric material layer 14L has a thickness that is sufficient to cover the entirety of the bottom electrode 12 including the via portion 12V and the base portion 12B.

Although the present application describes and illustrates the formation of a second interconnect dielectric material layer 14L at this point of the present application, the present application contemplates an embodiment in which the second interconnect dielectric material layer 14L is replaced by one of the dielectric capping layers mentioned above. A separate drawing is not needed for such an embodiment since the exemplary structure including the dielectric capping layer would look similar to the one depicted in FIG. 2 (i.e., 14L becomes the dielectric capping layer in such an embodiment).

Figure 3:
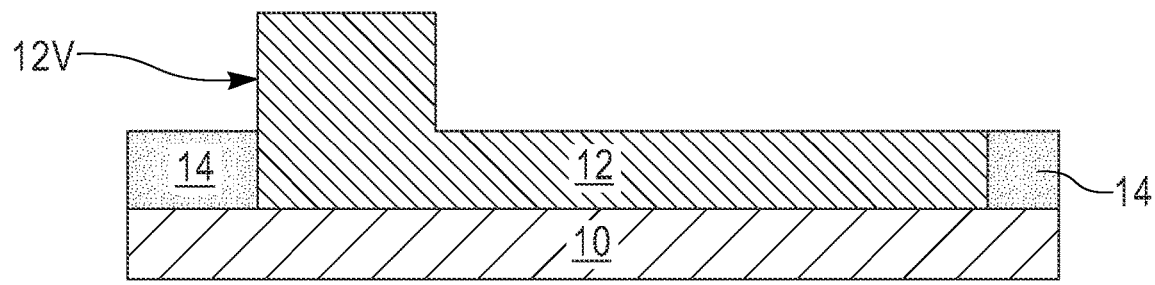
FIG. 3 is a cross sectional view of the exemplary structure of FIG. 2 after recessing the second interconnect dielectric material layer to physically expose the via portion and a topmost surface of the base portion of the bottom electrode.

Referring now to FIG. 3, there is illustrated the exemplary structure of FIG. 2 after recessing the second interconnect dielectric material layer 14L (or the dielectric capping layer, if the second interconnect dielectric material layer is replaced) to physically expose the via portion 12V and a topmost surface of the base portion 12B of the bottom electrode 12. The remaining second interconnect dielectric material layer 14L can be referred to herein as a recessed second interconnect dielectric material layer 14. If a dielectric capping layer is used, the remaining dielectric capping layer can be referred to as a recessed dielectric capping layer. A separate drawing is not needed for such an embodiment since the exemplary structure including the recessed dielectric capping layer would look similar to the one depicted in FIG. 3 (i.e., 14L becomes the recessed dielectric capping layer in such an embodiment).

The recessing can be performed utilizing an etch back process that is selective in removing a dielectric material as compared to the conductive electrode metal. In one example, the etch back process includes the use of $CF_4/C_4F_8O_2/Ar/N_2$ gas mixture as an etchant.

In some embodiments of the present application (and as shown in FIG. 3), the recessed second interconnect dielectric material layer 14 can have a topmost surface that is coplanar with a topmost surface of the base portion 12B of the bottom electrode 12. In some embodiments, the recessed second interconnect dielectric material layer 14 can have a topmost surface that is non-coplanar with (i.e., located above or below) the topmost surface of the base portion 12B of the bottom electrode 12.

Figure 4:
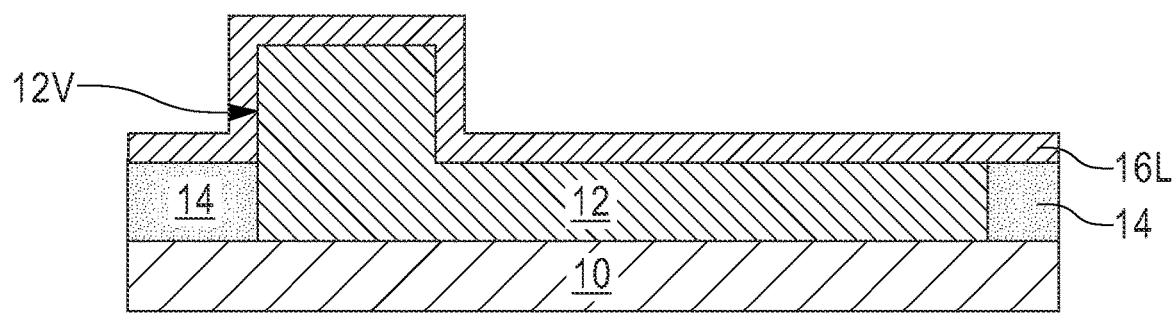
FIG. 4 is a cross sectional view of the exemplary structure of FIG. 3 after forming a high-k dielectric material liner on the physically exposed via portion and the base portion of the bottom electrode and the recessed second interconnect dielectric material layer.

Referring now to FIG. 4, there is illustrated the exemplary structure of FIG. 3 after forming a high-k dielectric material liner 16L on the physically exposed via portion 12V and the base portion 12B of the bottom electrode 12 and the recessed second interconnect dielectric material layer 14. In the illustrated embodiment shown in FIG. 4, the high-k dielectric material liner 16L covers the entire sidewall of the via portion 12V of the bottom electrode 12 and is not present along any sidewall of the base portion 12B of the bottom electrode 12 since the recessed second dielectric material layer 14 and the base portion 12B of the bottom electrode have topmost surfaces that are coplanar with each other. Other embodiments contemplate that the high-k dielectric material liner 16L covers an upper sidewall portion of the via portion 12V of the bottom electrode 12 and that the recessed second dielectric material layer 14 (or recessed dielectric capping layer) covers a lower sidewall portion of the via portion 12V of the bottom electrode 12. In yet another embodiment, and when the recessed second dielectric material layer 12 (or recessed dielectric capping layer) has a topmost surface that is below a topmost surface of the base portion 12B of the bottom electrode 12, the high-k dielectric material liner 16L can be present along an upper sidewall portion of the base portion 12B of the bottom electrode 12.

The term "high-k" as used with the phrase "high-k dielectric material liner" denotes a dielectric material that has a dielectric constant of greater than 4.0. The high-k dielectric material that provides the high-k dielectric material liner 16L can be a dielectric oxide, a dielectric nitride, a dielectric oxynitride, or a composite stack layer thereof. Exemplary high-k dielectric materials that provide the high-k dielectric material liner 16L include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2.

The high-k dielectric material liner 16L can be formed by any deposition process including, for example, CVD, PECVD, PVD, ALD or sputtering. In one embodiment of the present application, the high-k dielectric material liner 16L can have a thickness in a range from 1 nm to 10 nm. Other thicknesses that are lesser than, or greater than, the aforementioned thickness range can also be employed for the thickness of the high-k dielectric material liner 16L. In some embodiments, the high-k dielectric material liner 16L is a conformal layer. By "conformal layer" it is meant that a material layer has a thickness along horizontal surfaces that is the same as a thickness of the material layer along vertical surfaces. Conformal layers are formed utilizing a conformal deposition process such as, for example, CVD, PECVD or ALD.

Figure 5:
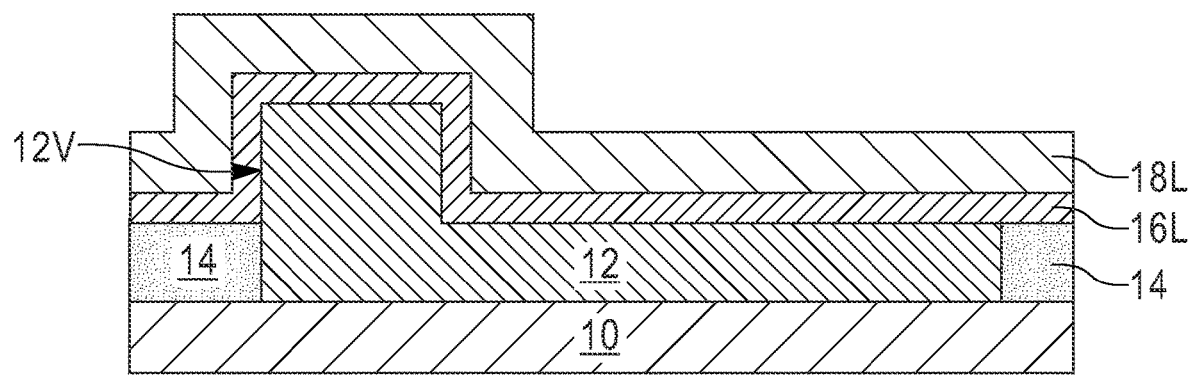
FIG. 5 is a cross sectional view of the exemplary structure of FIG. 4 after forming a top electrode metal-containing material layer on the high-k dielectric material liner.

Referring now to FIG. 5, there is illustrated the exemplary structure of FIG. 4 after forming a top electrode metal-containing material layer 18L on the high-k dielectric material liner 16L. The top electrode metal-containing material layer 18L can include one of the conductive electrode materials mentioned above for the bottom electrode metal-containing material layer that provides the bottom electrode 12. The conductive electrode material that provides the top electrode metal-containing material layer 18L also does not include copper (Cu) since copper is difficult to etch utilizing existing etching processes. The conductive electrode material that provides the top electrode metal-containing material layer 18L can be compositionally the same as, or compositionally different from, the conductive electrode material that provides the bottom electrode metal-containing material layer.

The top electrode metal-containing material layer 18L can be formed utilizing a deposition process including, for example, CVD, PECVD, PVD, ALD, sputtering, or other like deposition processes. The top electrode metal-containing material layer 18L can have a thickness from 10 nm to 50 nm; although other thicknesses are contemplated and can be used in the present application as the thickness of the top electrode metal-containing material layer 18L. The top electrode metal-containing material layer 18L can be a conformal layer.

Figure 6:
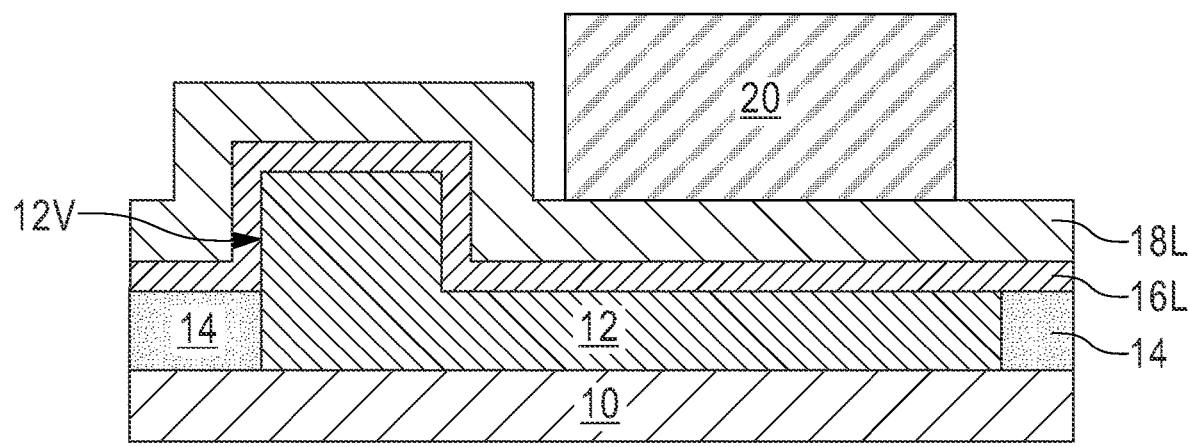
FIG. 6 is a cross sectional view of the exemplary structure of FIG. 5 after forming a first mask on a portion of the top electrode metal-containing material layer that is located above the base portion of the bottom electrode.

Referring now to FIG. 6, there is illustrated the exemplary structure of FIG. 5 after forming a first mask 20 on a portion of the electrode metal-containing material layer 18L that is located above the base portion 12B of the bottom electrode 12. The first mask 20 includes any conventional masking material or masking material stack. The first mask 20 can be formed by a deposition process and then patterned utilizing at least lithography (i.e., resist exposure and development). A separate etch can also be used to provide the first mask 20.

Figure 7:
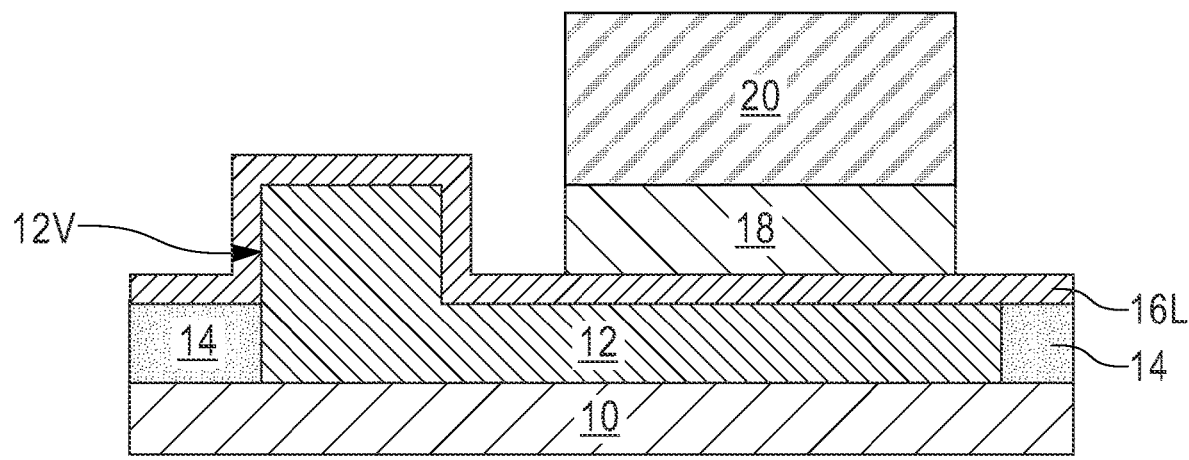
FIG. 7 is a cross sectional view of the exemplary structure of FIG. 6 after removing the top electrode metal-containing material layer that is not protected by the first mask, while maintaining a portion of the top electrode metal-containing material layer that is located beneath the first mask.

Referring now to FIG. 7, there is illustrated the exemplary structure of FIG. 6 after removing the top electrode metal-containing material layer 18L that is not protected by the first mask 20, while maintaining a portion of the top electrode metal-containing material layer that is located beneath the first mask 20. The maintained portion of the top electrode metal-containing material layer that is present beneath the first mask 20 can be referred to herein as a top electrode 18. In this embodiment of the present application, the top electrode 18 does not include a via portion. In this embodiment, the top electrode 18 has a constant thickness throughout the entire width and length of the top electrode 18.

The removal of the top electrode metal-containing material layer 18L that is not protected by the first mask 20 can be performed utilizing an etching process that is selective in removing the conductive electrode material that provides the top electrode metal-containing material layer 18L relative to the high-k dielectric material that provides the high-k dielectric material liner 16L. The etch stops on a surface of the high-k dielectric material liner 16L. In one example, the etch that is to remove the top electrode metal-containing material layer 18L that is not protected by the first mask 20 includes a mixture of $Cl_2/O_2/Ar/He$.

Figure 8:
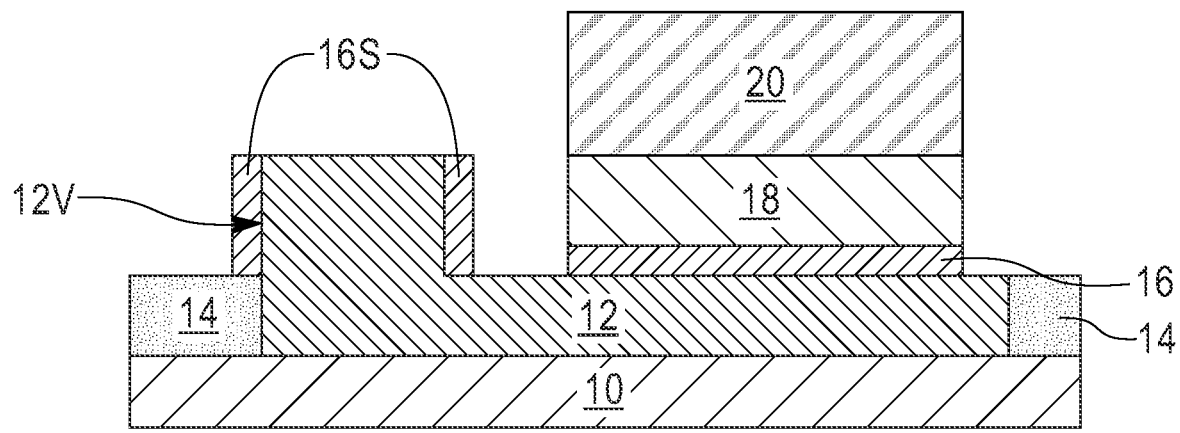
FIG. 8 is a cross sectional view of the exemplary structure of FIG. 7 after performing an etch process that removes physically exposed portions of the high-k dielectric material liner from all horizontal surfaces, while maintaining a first portion of the high-k dielectric material liner along the sidewalls of the via portion of the bottom electrode and a second portion of the high-k dielectric material liner that is located beneath the first mask.

Referring now to FIG. 8, there is illustrated the exemplary structure of FIG. 7 after performing an etch process that removes physically exposed portions of the high-k dielectric material liner 16L from all horizontal surfaces, while maintaining a first portion of the high-k dielectric material liner 16L along the sidewalls of the via portion 12V of the bottom electrode 12 and a second portion of the high-k dielectric material liner 16L that is located beneath the first mask 20. The maintained first portion of the high-k dielectric material liner 16L that is present along the sidewall of the via portion 12V of the bottom electrode 12 can be referred to herein as high-k dielectric spacer 16S, wherein the maintained second portion of the high-k dielectric material liner 16L that is located beneath the first mask 20 can be referred to as capacitor high-k dielectric material layer 16. The high-k dielectric spacer 16S provides isolation to the via portion 12V of the bottom electrode 12.

In the illustrated embodiment, the capacitor high-k dielectric material layer 16 and the top electrode 18 are vertically stacked one atop the other and the capacitor high-k dielectric material layer 16 has an outermost sidewall that is vertically aligned with an outermost sidewall of the top electrode 18. In the illustrated embodiment, the top electrode 18 has a topmost surface that is coplanar with a topmost surface of the via portion 12V of the bottom electrode 12. In the illustrated embodiment, the high-k dielectric spacer 16S have a topmost surface that is coplanar with a topmost surface of the via portion 12V of the bottom electrode 12. As is shown, the vertical material stack of the top electrode 18 and the capacitor high-k dielectric material layer 16 is positioned on the base portion 12B of the bottom electrode.

The etching process that is used to remove physically exposed portions of the high-k dielectric material liner 16L from all horizontal surfaces of the exemplary structure includes a high-k spacer etch back process. This etching process stops on a surface of the underlying bottom electrode 12. In one example, the high-k spacer etch back process includes a mixture of $CF_4/CHF_3/CH_3F/O_2$ plus additives such as $N_2/Ar/He$ as an etchant.

Figure 9:
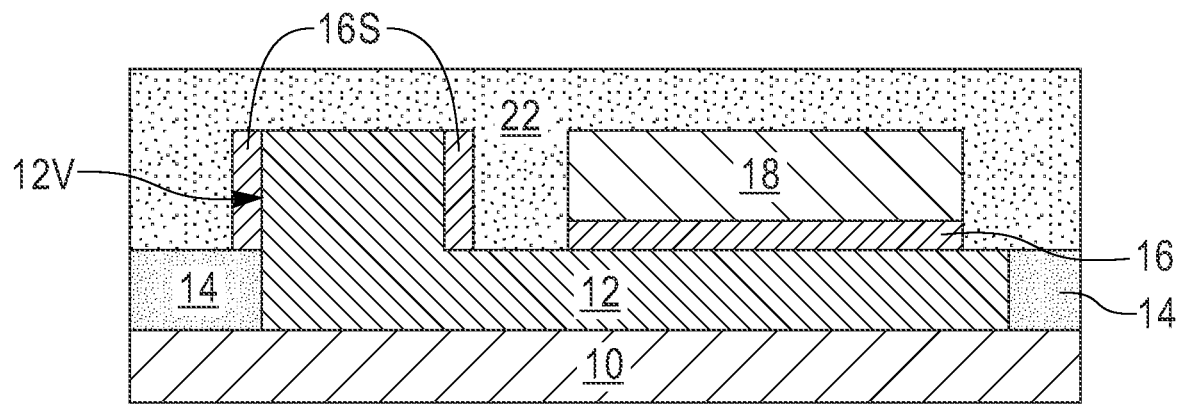
FIG. 9 is a cross sectional view of the exemplary structure of FIG. 8 after removing the first mask and forming a third interconnect dielectric material layer.

Referring now to FIG. 9, there is illustrated the exemplary structure of FIG. 8 after removing the first mask 20 and forming a third interconnect dielectric material layer 22. The first mask 20 can be removed utilizing one or more material removal processes. In one example, a combination of resist dry and wet stripping can be used to remove the first mask 20.

The third interconnect dielectric material layer 22 can include one of the dielectric materials mentioned above for the first interconnect dielectric material layer 10. The dielectric material that provides the third interconnect dielectric material layer 22 can be compositionally the same as, or compositionally different from, the dielectric material that provides the first interconnect dielectric material layer 10 and/or the second interconnect dielectric material layer 14L. The third interconnect dielectric material layer 22 can be formed utilizing one of the deposition processes mentioned above for forming the first interconnect dielectric material layer 10. The third interconnect dielectric material layer 22 has a thickness that is sufficient to cover the structure including the high-k dielectric spacer 16S and the via portion 12V of the bottom electrode 12 and the material stack including the capacitor high-k dielectric material layer 16 and the top electrode 18.

It is noted that the third interconnect dielectric material layer 22 is located laterally adjacent to the structure including the high-k dielectric spacer 16S and the via portion 12V of the bottom electrode 12 and laterally adjacent to the material stack including the capacitor high-k dielectric material layer 16 and the top electrode 18.

Figure 10A:
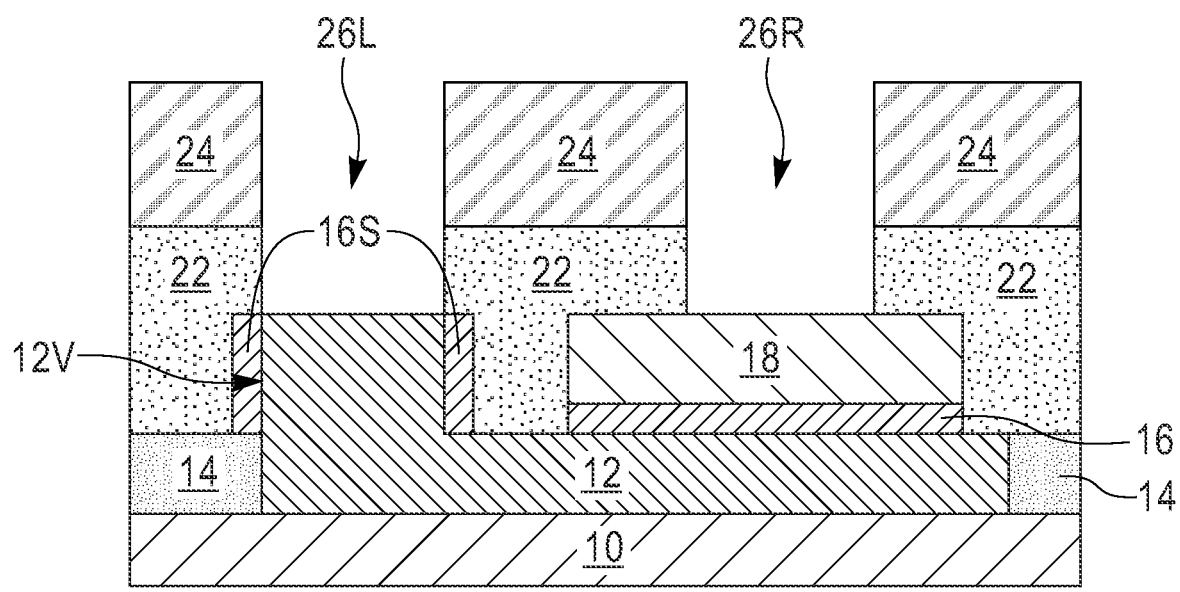
FIG. 10A is a cross sectional view of the exemplary structure of FIG. 9 after forming a first via contact opening into the third interconnect dielectric material layer that physically exposes a topmost surface of the via portion of the bottom electrode, and a second via contact opening that physically exposes a topmost surface of the maintained portion of the top electrode metal-containing material layer.

Referring now to FIG. 10A, there is illustrated the exemplary structure of FIG. 9 after forming a first via contact opening 26L into the third interconnect dielectric material layer 22 that physically exposes a topmost surface of the via portion 12V of the bottom electrode 12, and a second via contact opening 26R that physically exposes a topmost surface of the maintained portion of the top electrode metal-containing material layer 18L (i.e., the top electrode 18). The illustrated embodiment of FIG. 10A is for exemplary structure in which the via portion 12V of the bottom electrode 12 has a topmost surface that is coplanar with a topmost of the top electrode 18.

The formation of the first via contact opening 26L and the second via contact opening 26R into the third interconnect dielectric material layer 22 includes forming a second mask layer (not shown) on the third interconnect dielectric material layer 22. The second mask layer can include materials mentioned above for the first mask 20. The second mask layer can be formed by a deposition process. First and second via contact openings are then formed into the second mask layer to provide second mask 24. The forming of the first and second via contact openings into second mask layer includes at least lithography (i.e., resist exposure and development). A separate etch can follow the lithographic step to provide the first and second via contact openings into the second mask layer. The first and second via contact openings are then transferred to the third interconnect dielectric material layer 22 utilizing an etch such as, for example, a reactive ion etch using a base etch chemistry with $CF_4/C_4F_8/CH_2F_2$ plus additive gases such as $Ar/N_2/He$.

In this exemplary embodiment, and since the via portion 12V of the bottom electrode 12 has a topmost surface that is coplanar with a topmost of the top electrode 18, the etch used to form the first and second via contact openings 26L, 26R have identical etch times and thus no recessing (and thus no punch through) of either the via portion 12V of the bottom electrode 12 or the top electrode 18 occurs.

In some embodiments, at least an upper portion of the second mask 24 is removed during the etch of the third interconnect dielectric material layer 22. The remaining portion of the second mask 24 can be removed utilizing a separate material removal process. In other embodiments, the entire second mask 24 can be removed utilizing a separate etch than the etch used to provide the first and second via contact openings 26L, 26R into the third interconnect dielectric material layer 22.

Figure 10B:
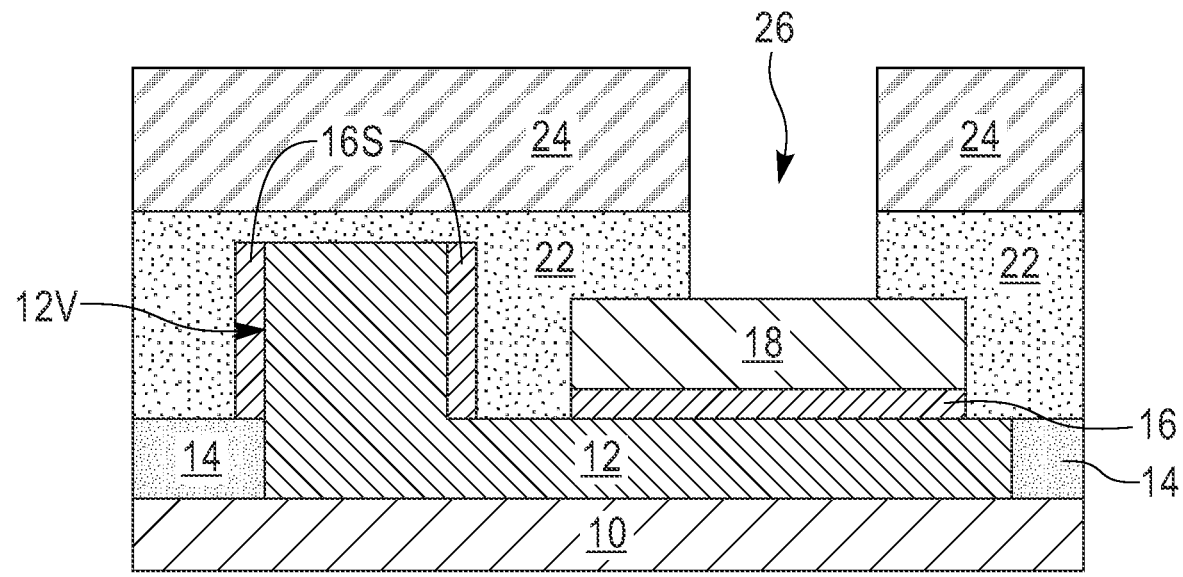
FIG. 10B is a cross sectional view of another exemplary structure of the present application after first performing the processing steps shown in FIGS. 1-9, and thereafter forming a single via contact opening that physically exposes a topmost surface of the maintained portion of the top electrode metal-containing material layer.

Referring now to FIG. 10B, there is illustrated another exemplary structure of the present application after first performing the processing steps shown in FIGS. 1-9, and thereafter forming a single via contact opening 26 that physically exposes a topmost surface of the maintained portion of the top electrode metal-containing material layer 18L (i.e., top electrode 18). In this exemplary structure, the via portion 12V of the bottom electrode 12 has a topmost surface that is above a topmost surface of the top electrode 18. The single via contact opening 26 is formed as described above for forming the first and second via contact openings 26L, 26R. Since only a single etch is used in this embodiment, the etch used to form the single via contact opening 26 that physically exposes the top electrode 18 can be easily controlled.

Figure 11A:
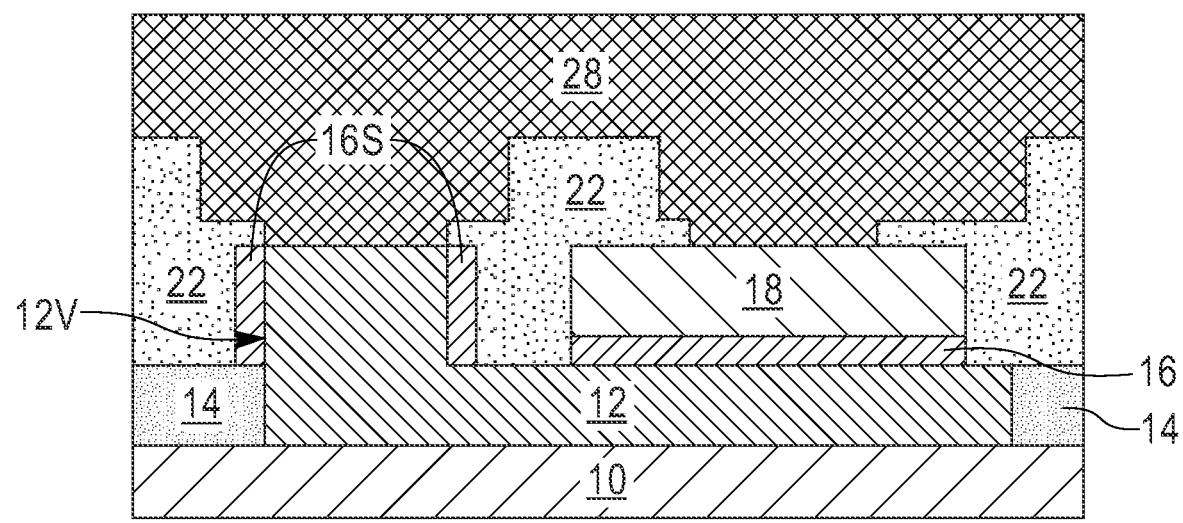
FIG. 11A is a cross sectional view of the exemplary structure of FIG. 10A after forming a first trench contact opening above the first via contact opening and a second trench contact opening above the second via contact opening, and forming a contact metal-containing layer that fills each of the first trench and via contact openings and the second trench and via contact openings and extends on to a topmost surface of the third interconnect dielectric material layer.

Referring now to FIG. 11A, there is illustrated the exemplary structure of FIG. 10A after forming a first trench contact opening (not specifically labeled) above the first via contact opening 26L and a second trench contact opening (not specifically labeled) above the second via contact opening 26R, and forming a contact metal-containing layer 28 that fills each of the first trench contact opening and via contact opening and the second trench and via contact openings and extends on to a topmost surface the third interconnect dielectric material layer 22. It is noted that in the present application, the trench contact opening has a width that is larger than a width of the via contact opening. Also, and in embodiments of the present application when both the trench contact opening and the via contact opening are present, the trench contact opening is located above and in communication with the via contact opening.

The first and second trench contact openings can be formed utilizing a trench mask (not shown) with the via openings partially filled with a sacrificial dielectric material such as, for example, an organic planarization layer (OPL). The trench pattern provided by the trench mask is then transferred to the third interconnect dielectric material layer 22 by an etch, and thereafter the sacrificial dielectric material and the trench mask are removed from the exemplary structure.

The contact metal-containing layer 28 is composed of any contact metal including, but not limited to, tungsten (W), copper (Cu), aluminum (Al), cobalt (Co), ruthenium (Ru), molybdenum (Mo), osmium (Os), iridium (Ir), rhodium (Rh) or an alloy thereof. The contact metal-containing layer 28 can be formed by any suitable deposition method such as, for example, ALD, CVD, PVD or plating.

In some embodiments and prior to forming the contact metal-containing layer 28, one or more contact diffusion barrier layers (not shown) can be formed inside the openings and atop the third interconnect dielectric material layer 22. In one or more embodiments, the contact diffusion barrier layer (not shown) can include a diffusion barrier material such as the diffusion barrier material mentioned above. The contact diffusion barrier layer can be formed utilizing a conformal deposition process including CVD or ALD. The contact diffusion barrier layer that is formed can have a thickness ranging from 1 nm to 5 nm, although lesser and greater thicknesses can also be employed.

Figure 11B:
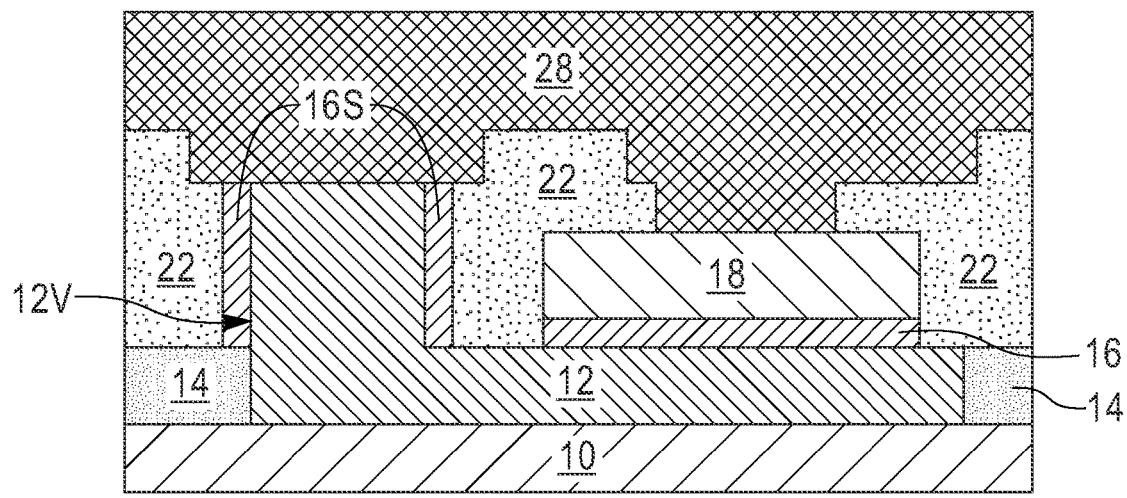
FIG. 11B is a cross sectional view of the another exemplary structure of FIG. 10B after forming a first trench contact opening above the via portion of the bottom electrode and a second trench contact opening above the single via contact opening, and forming a contact metal-containing layer that fills each of the first trench contact opening and the second trench and via contact openings and extends on to a topmost surface of the third interconnect dielectric material layer.

Referring now to FIG. 11B, there is illustrated the another exemplary structure of FIG. 10B after forming a first trench contact opening (not specifically labeled) above the via portion 12V of the bottom electrode 12 and a second trench contact via contact opening (not specifically labeled) above the single via contact opening 26, and forming a contact metal-containing layer 28 that fills each of the first trench contact opening and the second trench and via contact openings and extends on to a topmost surface the third interconnect dielectric material layer 22. The processing steps mentioned above for forming the trench openings into the third interconnect dielectric material layer 22 can be used in this embodiment of the present application. Also, the contact metal-containing layer 28 that is used in this embodiment is the same as that mentioned above for the embodiment depicted in FIG. 11A. One or more contact diffusion barrier layers can be formed as well.

Figure 12A:
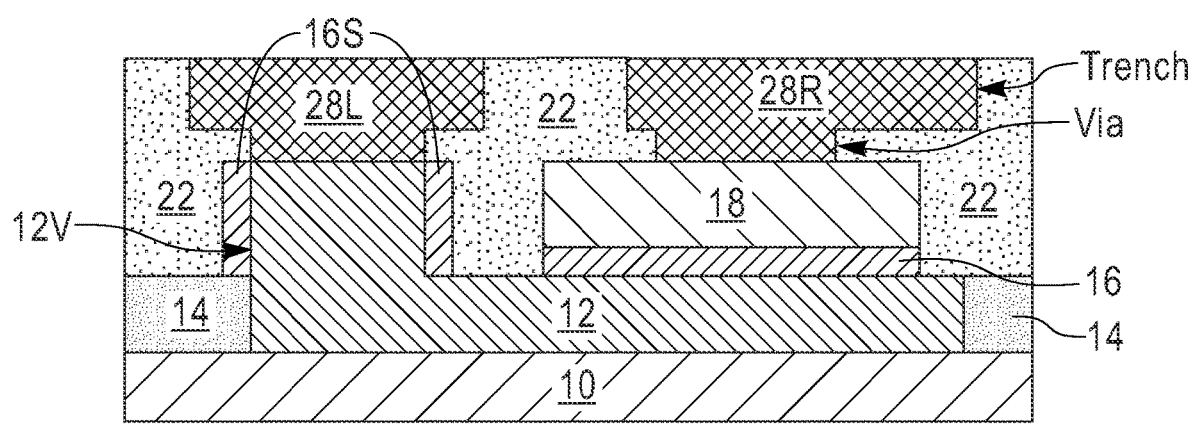
FIG. 12A is a cross sectional view of the exemplary structure of FIG. 11A after removing the contact metal-containing layer that is present on the topmost surface of the third interconnect dielectric material layer, while maintaining the contact metal-containing layer in each of the first trench and via contact openings and the second trench and via contact openings.

Referring now to FIG. 12A, there is illustrated the exemplary structure of FIG. 11A after removing the contact metal-containing layer 28 (and, if present, the one or more contact diffusion barrier layers) that is present on the topmost surface of the third interconnect dielectric material layer 22, while maintaining the contact metal-containing layer 28 (and, if present, the one or more contact diffusion barrier layers) in each of the first trench and via contact openings and the second trench and via contact openings. The contact metal-containing layer 28 that remains in the first trench and via contact openings provides a first contact structure 28L and the contact metal-containing layer 28 that remains the second trench and via contact openings provides a second contact structure 28R. If one of more diffusion barrier layers are present, this step also maintains diffusion barrier material within each of the openings (i.e., one or more diffusion barrier liners are present in the openings).

The first contact structure 28L has a lower via portion having a first width that is in direct physical contact with the via portion 12V of the bottom electrode 12 and an upper portion trench portion having a second width that is greater than the first width. The second contact structure 28L has a lower via portion having a first width that is in direct physical contact with the top electrode 18 and an upper portion trench portion having a second width that is greater than the first width. The first contact structure 28L has a topmost surface that is coplanar with a topmost surface of each of the second contact structure 28R and the third interconnect dielectric material layer 22.

The removal of the contact metal-containing layer 28 (and, if present, the one or more contact diffusion barrier layers) that is present on the topmost surface the third interconnect dielectric material layer 22 can be performed utilizing a planarization process such as, for example, CMP.

Figure 12B:
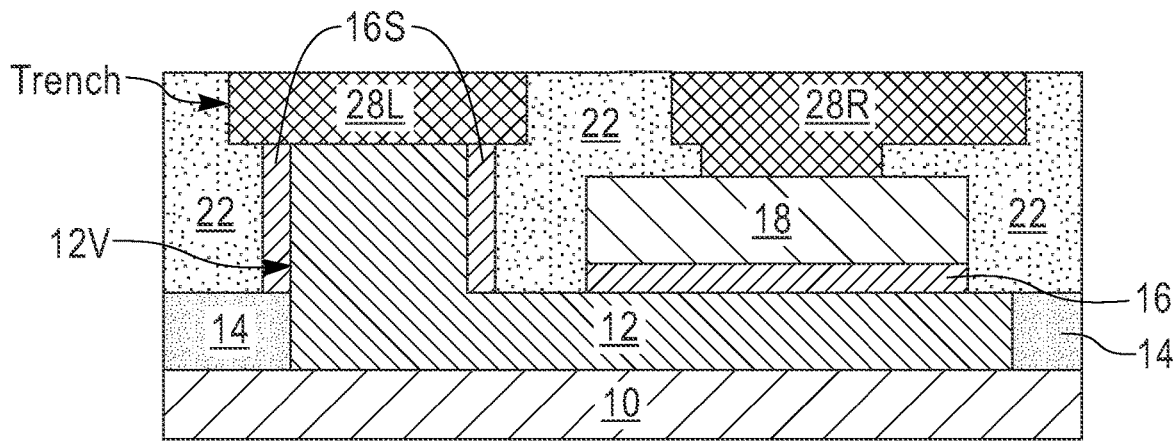
FIG. 12B is a cross sectional view of the another exemplary structure of FIG. 11B after removing the contact metal-containing layer that is present on the topmost surface of the third interconnect dielectric material layer, while maintaining the contact metal-containing layer in the first trench opening and in the second trench opening and the single via contact opening.

Referring now to FIG. 12B, there is illustrated another exemplary structure of FIG. 11B after removing the contact metal-containing layer 28 that is present on the topmost surface of the third interconnect dielectric material layer 22, while maintaining the contact metal-containing layer 28 in the first trench opening and in the second trench opening and the single via contact opening. The remaining contact metal-containing layer 28 in the first trench opening provides a first contact structure 28L, and the remaining contact metal-containing layer 28 the second trench opening and the single via contact opening provides a second contact opening 28R. The removal of the contact metal-containing layer 28 (and, if present, the one or more contact diffusion barrier layers) that is present on the topmost surface the third interconnect dielectric material layer 22 can be performed utilizing a planarization process such as, for example, CMP.

In this embodiment, the first contact structure 28L is in the shape of the first trench opening and the first contact structure 28L contacts a topmost surface of both the high-k dielectric spacer 16S and via portion 12V of the bottom electrode 12. Also, and in this embodiment, the second contact structure 28L has a lower via portion having a first width that is in direct physical contact with the top electrode 18 and an upper portion trench portion having a second width that is greater than the first width. The first contact structure 28L has a topmost surface that is coplanar with a topmost surface of each of the second contact structure 28R and the third interconnect dielectric material layer 22.

Figure 13:
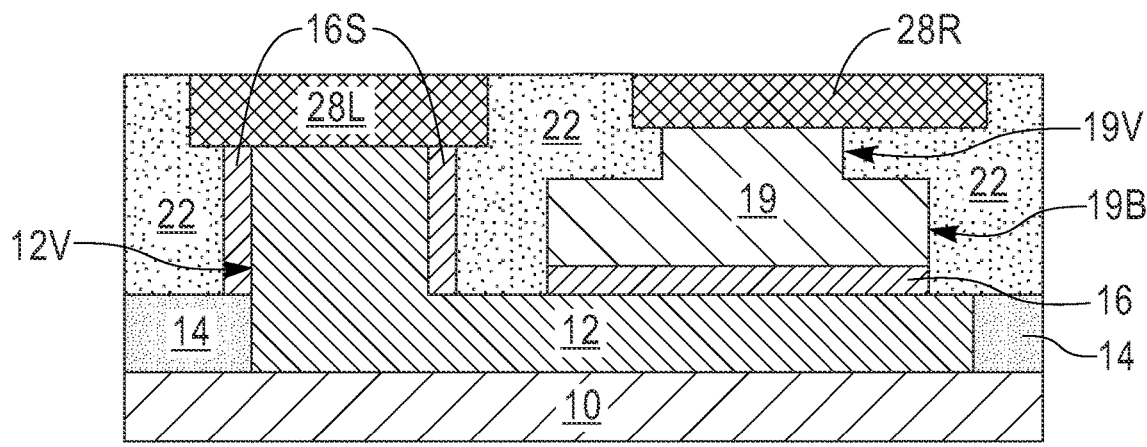
FIG. 13 is a cross sectional view of a further exemplary structure of the present application in which the bottom electrode and the top electrode both have a via portion and a base portion.

Referring now to FIG. 13, there is illustrated a further exemplary structure of the present application in which the bottom electrode 12 and the top electrode 19 both have a via portion and a base portion; all other materials are the same as in the previous embodiment of the present application. Notably, bottom electrode 12 includes via portion 12V and base portion 12B, and top electrode 19 includes via portion 19V and base portion 19B. The top electrode 19 of this embodiment includes materials mentioned above for the top electrode 18. Top electrode 19 is fabricated utilizing a subtractive via etch process as mentioned above for forming the bottom electrode 12. In this embodiment, no via contact openings are formed into the third interconnect dielectric material layer 22; only trench contact openings are formed and filled with a contact metal-containing layer 28.

Figure 14:
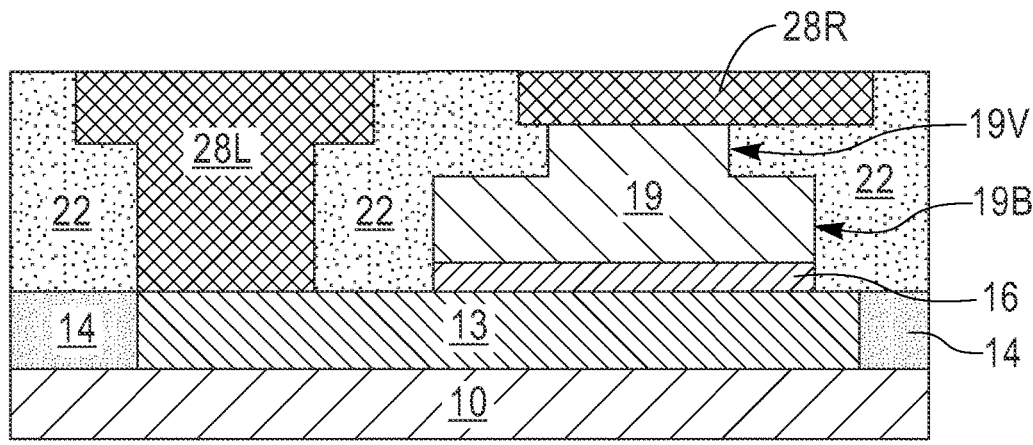
FIG. 14 is a cross sectional view of a yet further exemplary structure of the present application in which the top electrode, not the bottom electrode, has a via portion and a base portion.

Referring now to FIG. 14, there is illustrated a yet further exemplary structure of the present application in which the top electrode 19, not the bottom electrode 13, has a via portion 19V and a base portion 19B; all other materials are the same as in the previous embodiment of the present application. In this embodiment, bottom electrode 13 is composed of a bottom electrode material and is formed by deposition and etching. No subtractive via etch process is used. Bottom electrode 13 has a constant width throughout the entirety of the structure. The top electrode 19 of this embodiment includes materials mentioned above for the top electrode 18. Top electrode 19 is fabricated utilizing a subtractive via etch process as mentioned above for forming the bottom electrode 12 in the previous embodiment of the present application. In this embodiment, a via contact opening and a trench contact opening are formed into the third interconnect dielectric material layer 22 to physically expose a surface of bottom electrode 13. Only a trench contact opening is formed into the third interconnect dielectric material layer 22 to physically expose the surface of the via portion 19V of the top electrode 19.

In each of the embodiments shown in FIGS. 13 and 14, the base portion 19B of the top electrode 19 has an outermost sidewall that is vertically aligned with an outermost sidewall of the capacitor high-k dielectric material layer 16.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a bottom electrode located on a surface of an interconnect level, the bottom electrode having a base portion and a via portion that extends upward from a surface of the base portion;
   a capacitor high-k dielectric material layer located on the base portion of the bottom electrode;
   a high-k dielectric material spacer located along an entirety of a sidewall of the via portion of the bottom electrode, wherein the high-k dielectric material spacer and the capacitor high-k dielectric material layer are composed of a compositionally same high-k dielectric material, and wherein the high-k dielectric material spacer has a topmost surface that is coplanar with a topmost surface of the via portion of the bottom electrode and is entirely spaced apart from the capacitor high-k dielectric material layer;
   a top electrode located on the capacitor high-k dielectric material layer;
   a first contact structure contacting the via portion of the bottom electrode; and
   a second contact structure contacting the top electrode.

2. The structure of claim 1, wherein the topmost surface of the via portion of the bottom electrode is coplanar with a topmost surface of the top electrode.

3. The structure of claim 2, wherein each of the first contact structure and the second contact structure has a lower via portion having a first width and an upper trench portion having a second width that is greater than the first width.

4. The structure of claim 1, wherein the topmost surface of the via portion of the bottom electrode is higher than a topmost surface of the top electrode.

5. The structure of claim 4, wherein first contact structure has only a line portion and the second contact structure has a lower via portion having a first width and an upper trench portion having a second width that is greater than the first width.

6. The structure of claim 1, wherein the capacitor high-k dielectric material layer has an outermost sidewall that is vertically aligned with an outermost sidewall of the top electrode.

7. The structure of claim 1, wherein the top electrode is composed of a single piece and has a constant thickness.

8. The structure of claim 1, wherein the bottom electrode, the capacitor high-k dielectric material layer, the top electrode, the high-k dielectric spacer, the first contact structure and the second contact structure are embedded in a dielectric material stack.

9. The structure of claim 1, wherein the first contact structure has a topmost surface that is coplanar with a topmost surface of the second contact structure.

10. A structure comprising:
a bottom electrode located on a surface of an interconnect level, the bottom electrode having a base portion and a via portion that extends upward from a surface of the base portion;
a capacitor high-k dielectric material layer located on the base portion of the bottom electrode;
a high-k dielectric material spacer located along an entirety of a sidewall of the via portion of the bottom electrode, wherein the high-k dielectric material spacer and the capacitor high-k dielectric material layer are composed of a compositionally same high-k dielectric material, and wherein the high-k dielectric material spacer has a topmost surface that is coplanar with a topmost surface of the via portion of the bottom electrode and is entirely spaced apart from the capacitor high-k dielectric material layer;
a top electrode located on the capacitor high-k dielectric material layer, the top electrode having a base portion and a via portion that extends upward from a surface of the base portion;
a first contact structure contacting the via portion of the bottom electrode; and
a second contact structure contacting the via portion of the top electrode.

11. The structure of claim 10, wherein each of the first contact structure and the second contact structure has only a trench portion.

12. The structure of claim 10, wherein the base portion of the top electrode has an outermost sidewall that is vertically aligned with an outermost sidewall of the capacitor high-k dielectric material layer.

13. The structure of claim 10, wherein the first contact structure has a topmost surface that is coplanar with a topmost surface of the second contact structure.

14. A structure comprising:
a bottom electrode located on a surface of an interconnect level;
a capacitor high-k dielectric material layer located on the bottom electrode;
a top electrode located on the capacitor high-k dielectric material layer, the top electrode having a base portion and a via portion that extends upward from a surface of the base portion;
a first contact structure directly contacting the bottom electrode; and
a second contact structure contacting the via portion of the top electrode, wherein the capacitor high-k dielectric material layer is located entirely above a topmost surface of the bottom electrode and is laterally spaced apart from the first contact structure.

15. The structure of claim 14, wherein first contact structure has a lower via portion having a first width and an upper trench portion having a second width that is greater than the first width, and the second contact structure has only a line portion.

16. The structure of claim 14, wherein the base portion of the top electrode has an outermost sidewall that is vertically aligned with an outermost sidewall of the capacitor high-k dielectric material layer.

17. The structure of claim 14, wherein the first contact structure has a topmost surface that is coplanar with a topmost surface of the second contact structure.

* * * * *